United States Patent
Tsujikawa et al.

(10) Patent No.: US 10,813,227 B2
(45) Date of Patent: Oct. 20, 2020

(54) COMPONENT MOUNTER AND MOUNTING BOARD MANUFACTURING METHOD

(71) Applicant: Panasonic Intellectual Property Management Co., Ltd., Osaka (JP)

(72) Inventors: Toshihiko Tsujikawa, Osaka (JP); Akira Kameda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 293 days.

(21) Appl. No.: 15/785,732

(22) Filed: Oct. 17, 2017

(65) Prior Publication Data

US 2018/0132359 A1  May 10, 2018

(30) Foreign Application Priority Data

Nov. 4, 2016 (JP) ................. 2016-215769

(51) Int. Cl.
*H05K 3/00* (2006.01)
*H05K 3/36* (2006.01)
*H05K 3/30* (2006.01)
*H01L 21/48* (2006.01)

(52) U.S. Cl.
CPC ......... *H05K 3/301* (2013.01); *H01L 21/4846* (2013.01); *H05K 3/0008* (2013.01); *H05K 3/361* (2013.01)

(58) Field of Classification Search
CPC ........... H05K 13/0812; H05K 13/0815; H05K 13/0015; H05K 3/323; H05K 2203/0278; H05K 3/361; G02F 1/13452; G02B 6/4221; G02B 6/4222; G02B 6/4224
See application file for complete search history.

(56) References Cited

U.S. PATENT DOCUMENTS 7,483,277 B2 * 1/2009 Sakai ................. H05K 13/0812
361/761

FOREIGN PATENT DOCUMENTS

JP        2013-250375 A       12/2013

* cited by examiner

Primary Examiner — Livius R. Cazan
(74) Attorney, Agent, or Firm — Pearne & Gordon LLP

(57) ABSTRACT

In a component press-bonding device that performs work related to component mounting on a board after a mark provided on a transparent end region of the board is recognized, an imaging camera provided with an imaging optical axis extending downwards, a light emitter that irradiates the end region with illumination light from above the board in a state where the mark is positioned within an imaging visual field of the imaging camera, and a light reflecting member that is provided below the imaging camera and reflects the illumination light, which is emitted by the light emitter and is transmitted downwards through the end region, back to the end region are included. The imaging camera images the mark under the illumination light, which is reflected by the light reflecting member and is transmitted upwards through the end region.

7 Claims, 12 Drawing Sheets

COMPONENT MOUNTER AND MOUNTING BOARD MANUFACTURING METHOD

BACKGROUND

1. Technical Field

The present disclosure relates to a component mounter that performs work related to component mounting on a board.

2. Description of the Related Art

In a liquid crystal display manufacturing line, a tape sticking step of sticking bonding tape for bonding components to an end region of a board, a component placing step of placing a component on the board with aid of the bonding tape stuck to the board, and component press-bonding work of pressing and press-bonding the component, which is placed on the board, to the board are sequentially executed. In a component mounter, such as a tape sticking device that executes tape sticking work in such a manufacturing line and a component press-bonding device that executes a component press-bonding step in such a manufacturing line, a mark provided on an end region of a board is imaged from above and is recognized by an imaging camera before carrying out work on the board (refer to Japanese Patent Unexamined Publication No. 2013-250375). When imaging the mark, in general, illumination light is emitted to the mark (downwards) from a light emitter provided in the vicinity of the imaging camera, and the imaging camera images the mark under reflected illumination light, which is obtained by the illumination being reflected by an outer surface of the mark.

SUMMARY

According to the disclosure, there is provided a component mounter that performs work related to component mounting on a board after a mark provided on a transparent end region of the board is recognized. The component mounter includes an imaging camera provided with an imaging optical axis extending downwards, a light emitter that irradiates the end region with illumination light from above the board in a state where the mark is positioned within an imaging visual field of the imaging camera, and a light reflecting member that is provided below the imaging camera and reflects the illumination light, which is emitted by the light emitter and is transmitted downwards through the end region, back to the end region. The imaging camera images the mark under the illumination light, which is reflected by the light reflecting member and is transmitted upwards through the end region.

According to the disclosure, the mark provided on the board can be clearly recognized even in a case where the board is formed of a film member.

DETAILED DESCRIPTION

Prior to the description of an exemplary embodiment, a problem of the related art will be briefly described.

In a case where a board is formed of a film member as in a flexible board, deformation, such as a wrinkle and a warp, occurs in an end region of the board, on which a mark is provided. When an imaging camera images the mark under reflected illumination light in such a state, a problem, in which the illumination light reflected by an outer surface of the mark is unlikely to be incident to the imaging camera, an image of the mark is unclear, and a recognition error occurs, may arise.

An object of the disclosure is to provide a component mounter, which can perform work of clearly recognizing marks provided on a board even in a case where the board is formed of a film member, and a mounting board manufacturing method.

Figure 1:
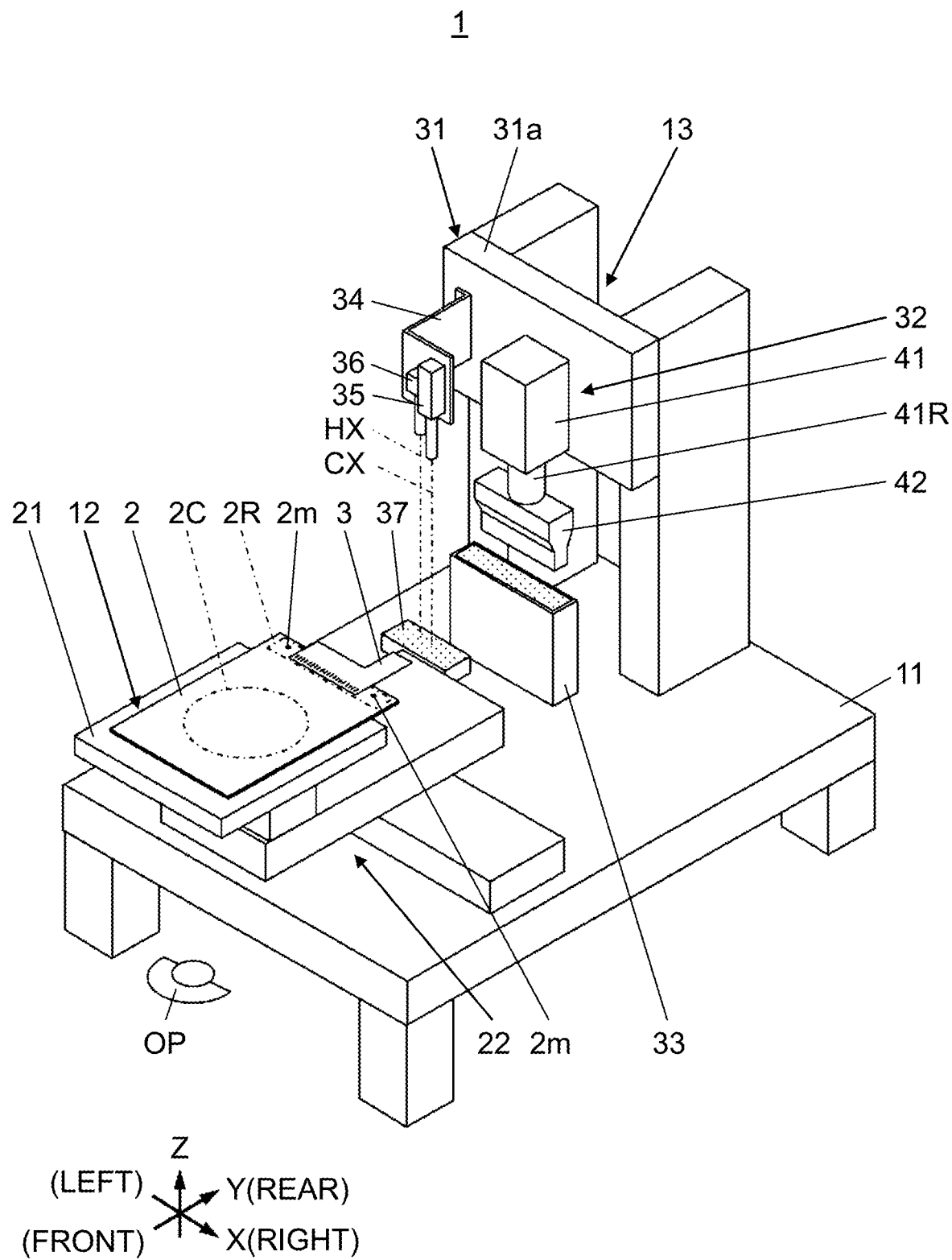
FIG. 1 is a perspective view of a component press-bonding device according to an exemplary embodiment of the disclosure.
Figure 2:
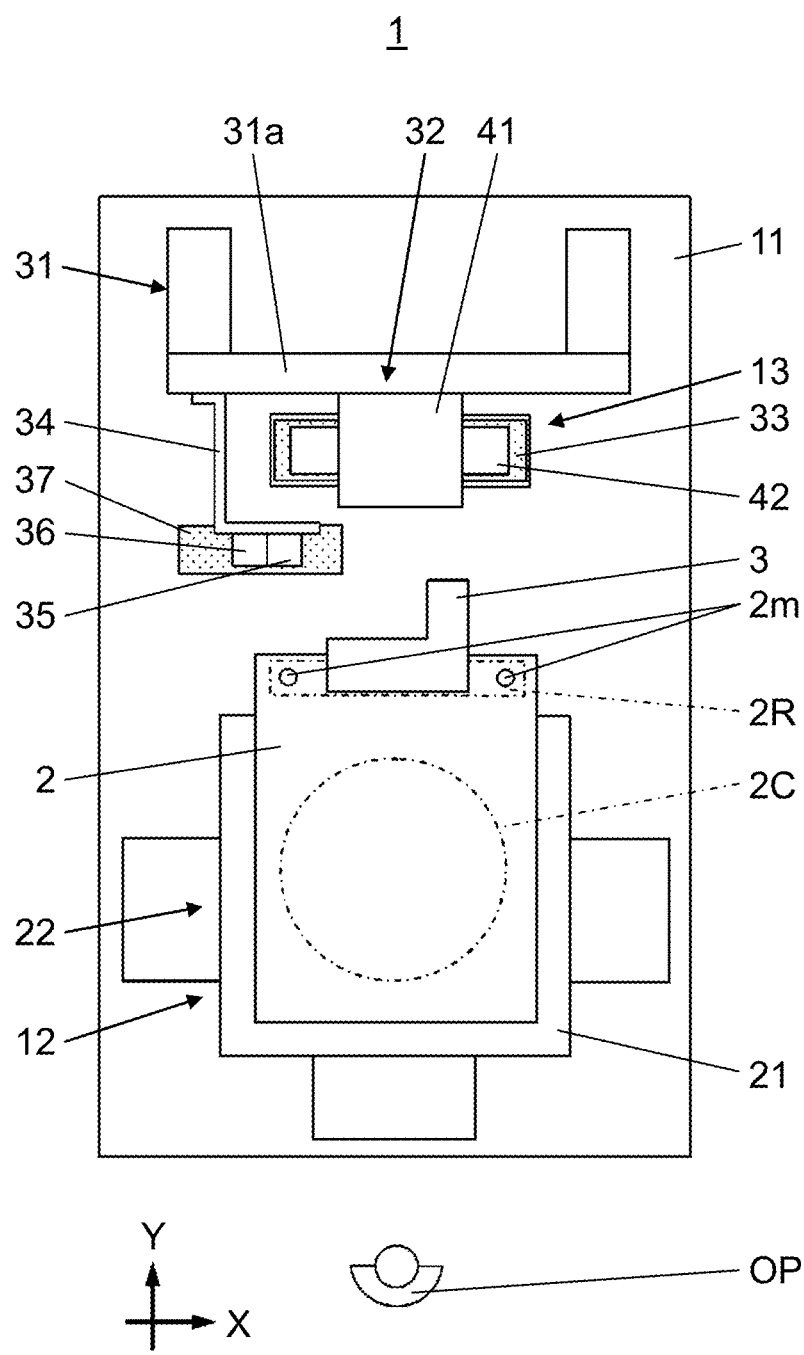
FIG. 2 is a plan view of the component press-bonding device according to the exemplary embodiment of the disclosure.
Figure 3:
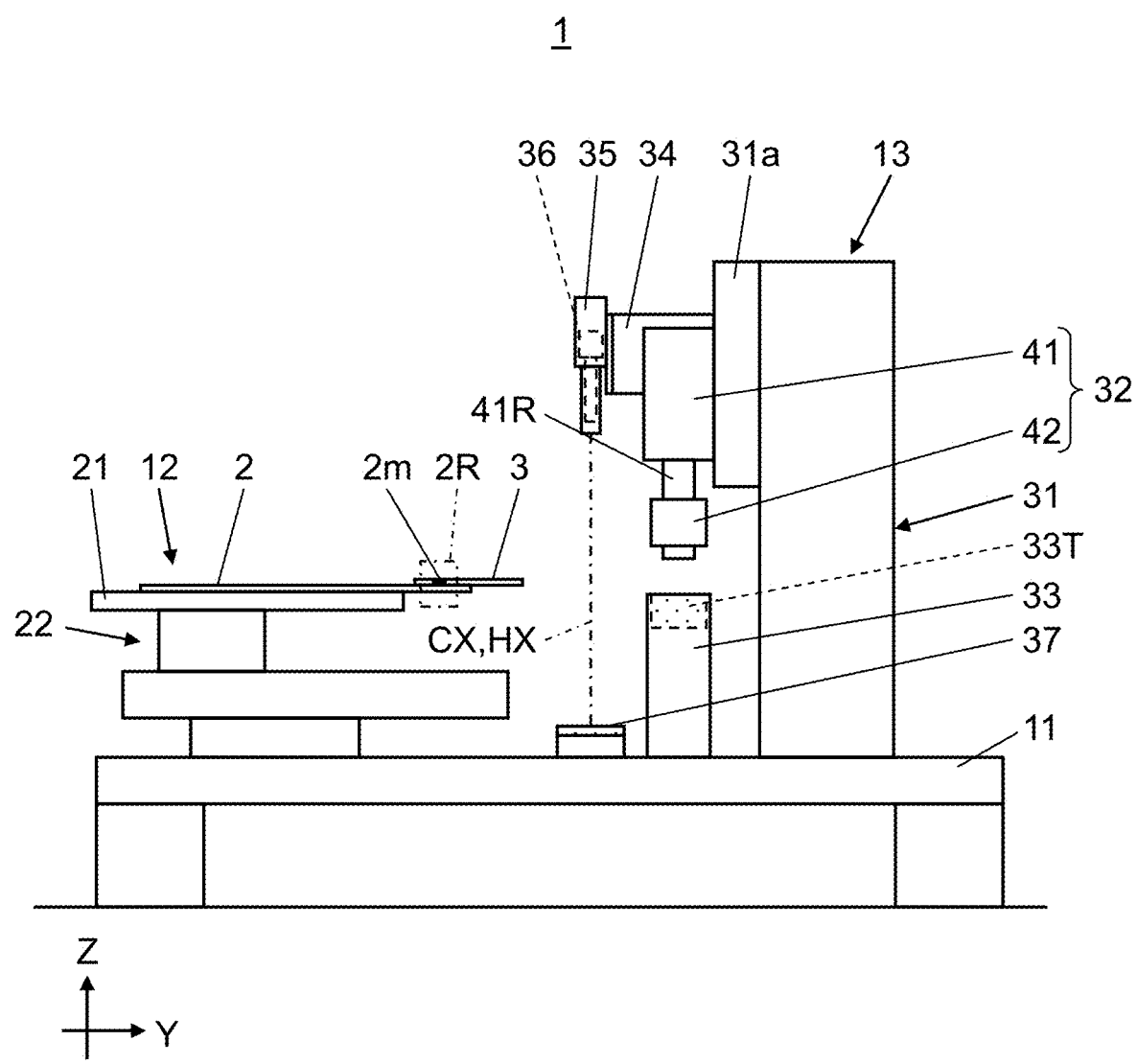
FIG. 3 is a side view of the component press-bonding device according to the exemplary embodiment of the disclosure.

Hereinafter, the exemplary embodiment of the disclosure will be described with reference to the drawings. Component press-bonding device 1 is illustrated in FIG. 1, FIG. 2, and FIG. 3 as an exemplary embodiment of the component mounter of the disclosure, and is a device that presses component 3 placed (temporarily press-bonded) in end region 2R of board 2 with aid of bonding tape for bonding components (not illustrated), such as anisotropic conductive film (ACF), to press-bond (finally press-bond) to board 2. In the following description, a right-and-left direction of component press-bonding device 1 seen from operator OP will be referred to as an X-axis direction, and a front-and-rear direction of component press-bonding device 1 seen from operator OP will be referred to as a Y-axis direction. An up-and-down direction of component press-bonding device 1 will be referred to as a Z-axis direction. A positive direction of a Z-axis will be referred to as upwards, and a negative direction of the Z-axis will be referred to as downwards.

In FIG. 1, FIG. 2, and FIG. 3, component press-bonding device 1 includes board mover 12 and component press-bonding portion 13, on base 11. Board mover 12 is provided in a region in front (the immediate front of operator OP) of base 11. Component press-bonding portion 13 is provided in a region at the rear of board mover 12.

Board 2 is formed of a rectangular film member. At least end region 2R, out of regions of board 2, is transparent, and two marks 2m are provided in this end region 2R. These two marks 2m are positioned at positions where component 3 placed in end region 2R is interposed between the marks on both ends of the board in the X-axis direction (FIG. 1 and FIG. 2). After marks 2m of board 2 are recognized, component press-bonding device 1 performs work related to component mounting on board 2 (specifically, work of press-bonding component 3 to board 2).

In FIG. 1, FIG. 2, and FIG. 3, board mover 12 includes board holding table 21 that holds board 2 and table moving mechanism 22 that moves board holding table 21. Board holding table 21 holds the board by sucking a lower surface of middle portion 2C of board 2 through a suction-hole (not illustrated) provided in an upper surface. In a state where board 2 is held by board holding table 21, end region 2R of board 2 comes into a state of protruding from a rear edge of board holding table 21. Table moving mechanism 22 operates board holding table 21 to move board 2 held by board holding table 21 in the X-axis direction, the Y-axis direction, and the Z-axis direction.

In FIG. 1, FIG. 2, and FIG. 3, component press-bonding portion 13 includes gate-shaped base portion 31 provided on base 11, presser 32 attached to horizontal portion 31a of base portion 31, which extends in the X-axis direction, and backup stage 33 provided below presser 32. Imaging camera 35 and light emitter 36 are provided on horizontal portion 31a of base portion 31 via bracket 34. Below imaging camera 35 and light emitter 36, light reflecting member 37 is provided on base 11.

In FIG. 1 and FIG. 3, presser 32 includes pressing cylinder 41, which is attached to horizontal portion 31a and of which piston rod 41R extends downwards, and press tool 42, which is attached to a lower end of piston rod 41R of pressing cylinder 41. Press tool 42 has a shape of extending in the X-axis direction.

In FIG. 1 and FIG. 3, imaging camera 35 is attached to bracket 34 in a state where imaging optical axis CX extends downwards. Imaging optical axis CX of imaging camera 35 passes through a position in front of backup stage 33, and the height of imaging camera 35 is set such that an area at the height of an upper surface of board 2 held by board holding table 21 (that is, the heights of marks 2m) is in focus. For this reason, imaging camera 35 can image in a state where these marks 2m are in focus in a case where marks 2m, which are included in board 2 held by board holding table 21, are positioned at predetermined positions in front of backup stage 33 (positions on imaging optical axis CX of imaging camera 35 or in the vicinity of the imaging optical axis, which are positions at the height of the upper surface of board 2).

Light emitter 36 is provided in the vicinity of imaging camera 35, and emits illumination light downwards. Irradiation optical axis HX of the illumination light emitted by light emitter 36 is almost parallel to imaging optical axis CX of imaging camera 35 (refer to FIG. 1), but is not coaxial (non-coaxial). In a state where marks 2m are positioned within an imaging visual field of imaging camera 35 by table moving mechanism 22 moving board holding table 21 that holds board 2 (that is, board 2 is relatively moved with respect to imaging camera 35), light emitter 36 emits illumination light downwards from above board 2 to end region 2R (specifically, to a region in the vicinity of marks 2m). For this reason, the illumination light emitted by light emitter 36 passes downwards through an in-focus region of imaging camera 35 (or a region in the vicinity of the in-focus region).

In FIG. 1, FIG. 2, and FIG. 3, light reflecting member 37 is provided at a position below imaging camera 35 on base 11. Light reflecting member 37 reflects illumination light, which is emitted by light emitter 36 from above board 2 and is transmitted downwards through transparent end region 2R of board 2, back to end region 2R of board 2 (to imaging camera 35). Herein, if light reflecting member 37 has a retro-reflective function, the light incident to light reflecting member 37 is reflected in a direction almost parallel to an incident direction thereof, such that the reflected illumination light can be reliably incident to imaging camera 35, which is preferable.

Figure 4:
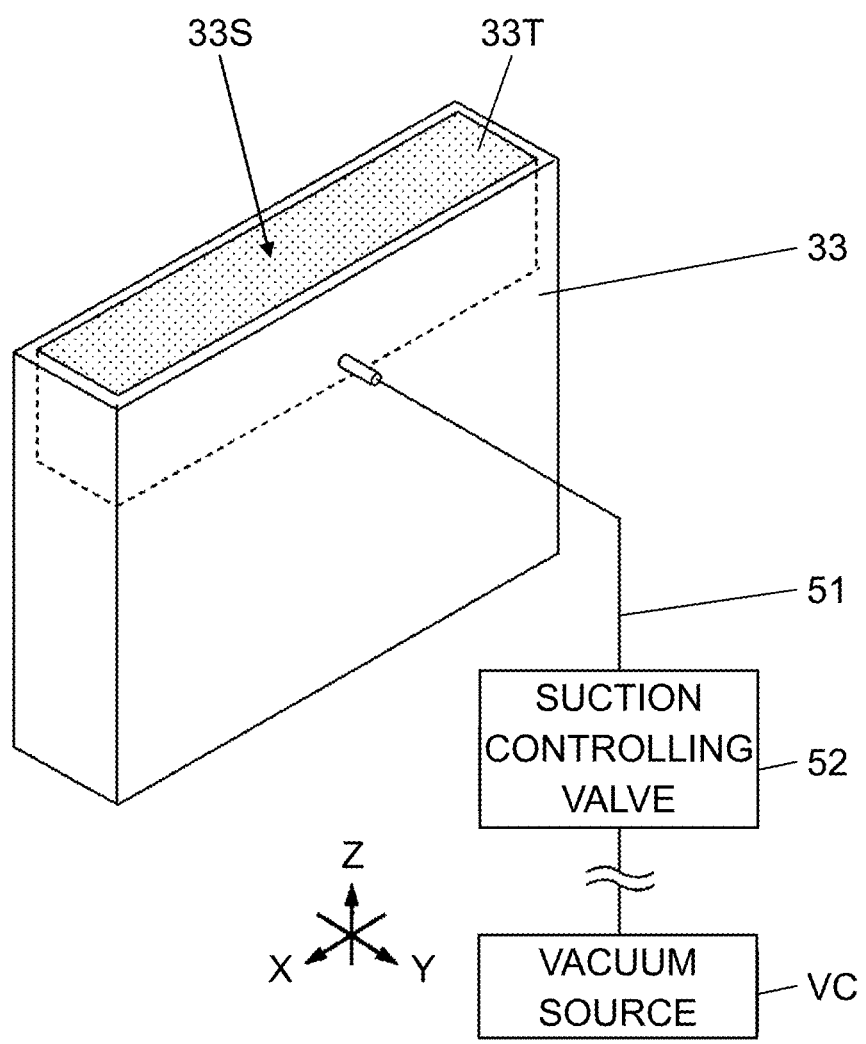
FIG. 4 is a perspective view of a backup stage included in the component press-bonding device according to the exemplary embodiment of the disclosure.

In FIG. 4, block-shaped porous material portion 33T formed of a porous member is provided on an upper portion of backup stage 33 (also refer to FIG. 3). Upper surface 33S of porous material portion 33T is a supporting surface that supports the lower surface of end region 2R of board 2, of which middle portion 2C is held by board holding table 21.

In FIG. 4, suction pipeline 51 that is linked to porous material portion 33T is connected to backup stage 33. Suction pipeline 51 extends to the outside of backup stage 33 and is connected to suction controlling valve 52. Suction controlling valve 52 is linked to vacuum source VC provided outside component press-bonding device 1.

When suction controlling valve 52 is operated to supply a vacuum pressure fed by vacuum source VC to suction pipeline 51, suction force is generated on upper surface 33S of porous material portion 33T through small holes of a porous material that forms porous material portion 33T. When suction force is generated on upper surface 33S of porous material portion 33T in a state where end region 2R of board 2 is supported by backup stage 33, end region 2R of board 2 is sucked to a porous material portion 33T side and comes into close contact with upper surface 33S of porous material portion 33T.

Figure 5:
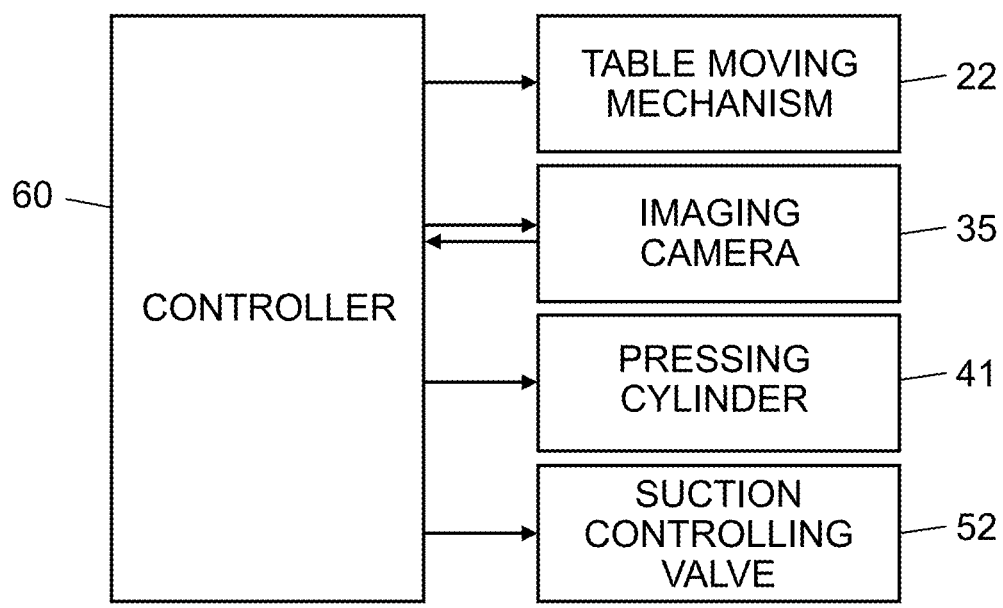
FIG. 5 is a block diagram showing a control system of the component press-bonding device according to the exemplary embodiment of the disclosure.

In FIG. 5, controller 60 included in component press-bonding device 1 controls each of operations, such as the movement of board holding table 21 (that is, board 2) by means of table moving mechanism 22, imaging by means of imaging camera 35, the elevation of press tool 42 by means of pressing cylinder 41, and the generation of suction force on upper surface 33S of porous material portion 33T by means of suction controlling valve 52. Image data obtained by the imaging of imaging camera 35 is transmitted to controller 60, and image recognition processing is performed.

Next, the procedures of executing component press-bonding work of component press-bonding device 1 press-bonding component 3 to board 2 will be described. In component press-bonding work, first, board holding table 21 receives board 2 sent from an upstream step side (board 2 on which component 3 is placed in end region 2R) and suction-holds middle portion 2C of this board 2 (FIG. 1, FIG. 2, and FIG. 3).

Figure 6:
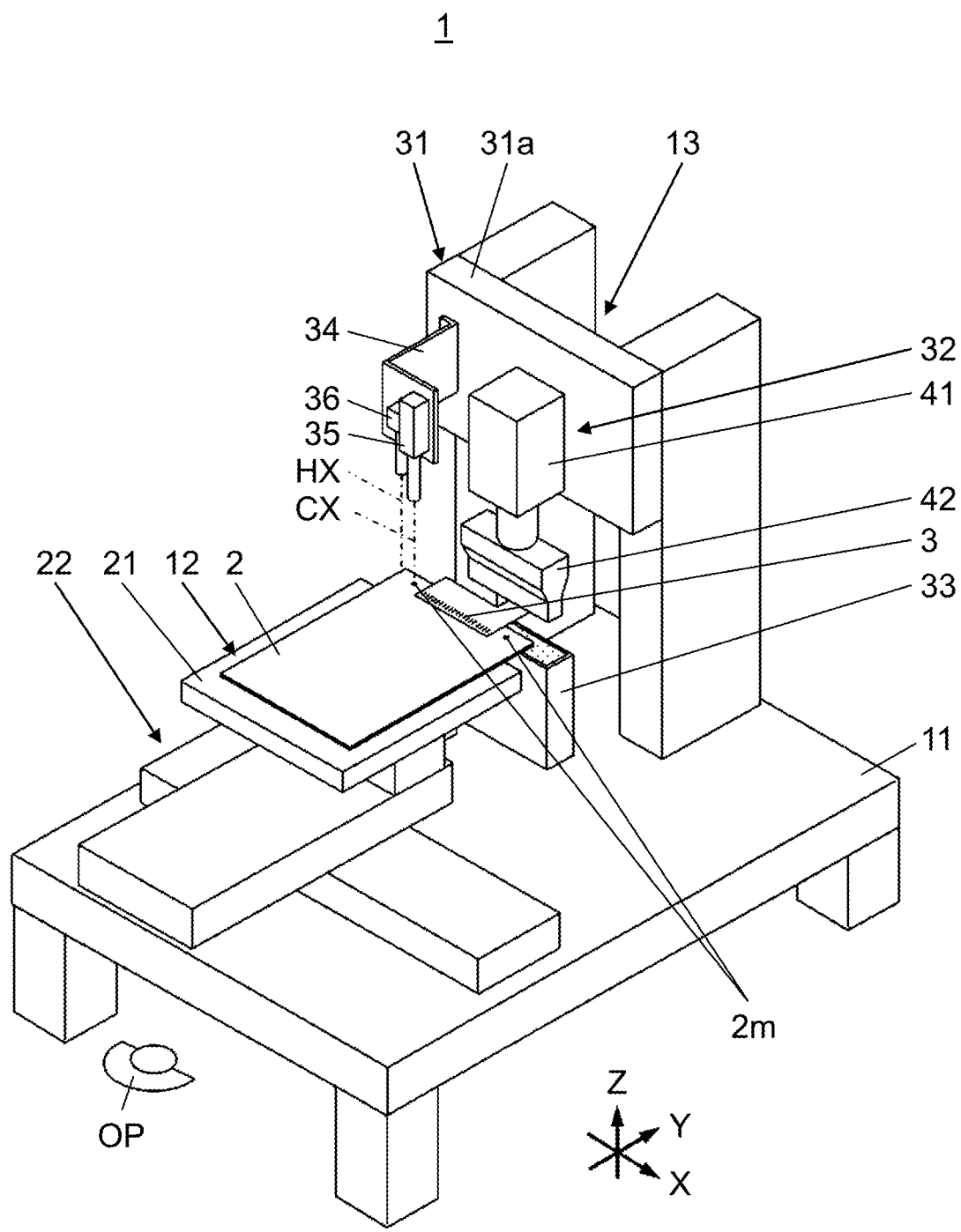
FIG. 6 is a perspective view illustrating a state where the component press-bonding device according to the exemplary embodiment of the disclosure images marks of a board.
Figure 7:
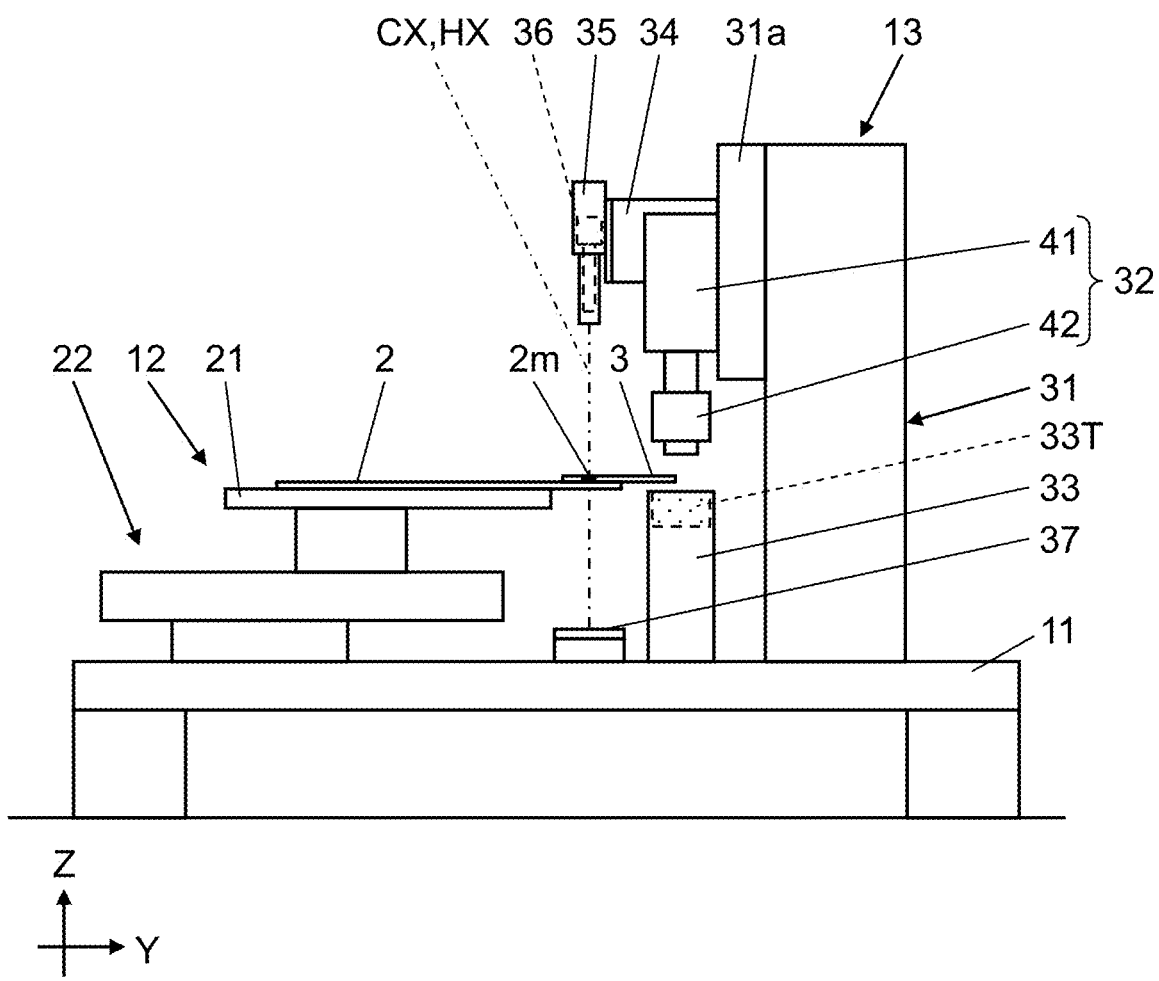
FIG. 7 is a side view illustrating the state where the component press-bonding device according to the exemplary embodiment of the disclosure images the marks of the board.
Figure 8A:
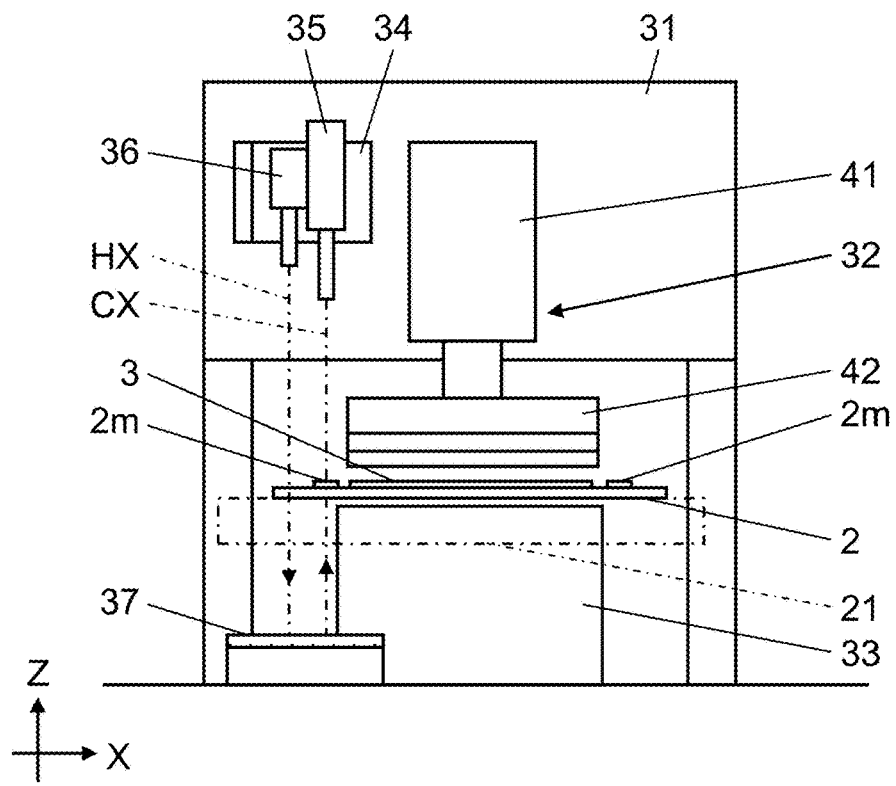
FIG. 8A is a front view illustrating the state where the component press-bonding device according to the exemplary embodiment of the disclosure images the marks of the board.

When board holding table 21 suction-holds middle portion 2C of board 2, table moving mechanism 22 operates to move board holding table 21, and to sequentially position two marks 2m of board 2 within the imaging visual field of imaging camera 35. Imaging camera 35 images and recognizes two marks 2m (FIG. 6, FIG. 7, and FIG. 8A).

When imaging camera 35 images marks 2m positioned within the imaging visual field of imaging camera 35, light emitter 36 emits illumination light downwards (specifically, to marks 2m within end region 2R) (light emission step). The illumination light emitted from light emitter 36 is transmitted downwards through end region 2R of board 2 and is reflected upwards by light reflecting member 37 (light reflection step). Then, the light is transmitted upwards through end region 2R of board 2 and reaches imaging camera 35. In this state, imaging camera 35 images marks 2m (imaging step).

Figure 9A:
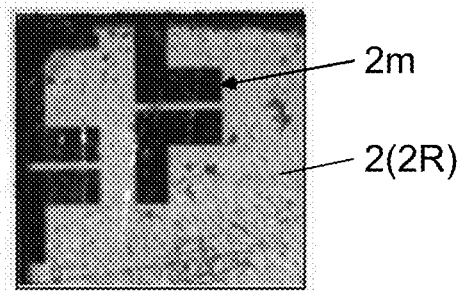
FIG. 9A is a view illustrating an example of an image obtained by an imaging camera, which is included in the component press-bonding device according to the exemplary embodiment of the disclosure, imaging the marks of the board.
Figure 9B:
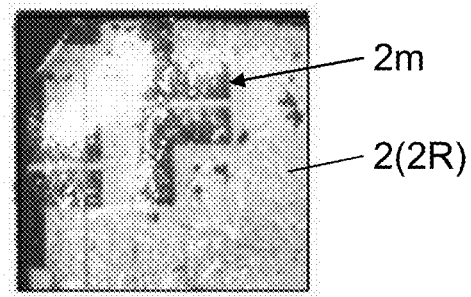
FIG. 9B is a view illustrating an example of an image obtained by the imaging camera, which is included in the component press-bonding device according to the exemplary embodiment of the disclosure, imaging the marks of the board.

Although imaging camera 35 images marks 2m under such circumstances, an image of marks 2m is clear (refer to FIG. 9A) as marks 2m, which are illuminated by the transmitted illumination light that is as if emitted from below board 2, are placed within the imaging visual field of imaging camera 35. For this reason, even in a case where deformation, such as a wrinkle and a warp, occurs in end region 2R of board 2, controller 60 can clearly recognize marks 2m with little effect of such deformation, such as a wrinkle and a warp. When deformation, such as a wrinkle and a warp, occurs in end region 2R of board 2, light reflected by outer surfaces of marks 2m is unlikely to be incident to imaging camera 35 in a case where imaging camera 35 images marks 2m under reflected illumination light. Thus, an image of marks 2m is unclear (FIG. 9B).

As described above, after light emitted by light emitter 36 is transmitted downwards through end region 2R of board 2 and is reflected by light reflecting member 37, imaging camera 35 images marks 2m of board 2 under the illumination light transmitted upwards through the end region of board 2, in component press-bonding device 1 of the exemplary embodiment. For this reason, even in a case where deformation, such as a wrinkle and a warp, occurs in the region in the vicinity of marks 2m of board 2 (end region 2R), which is formed of a film member, marks 2m can be imaged under a sufficient amount of illumination light and marks 2m can be accurately recognized.

Figure 8B:
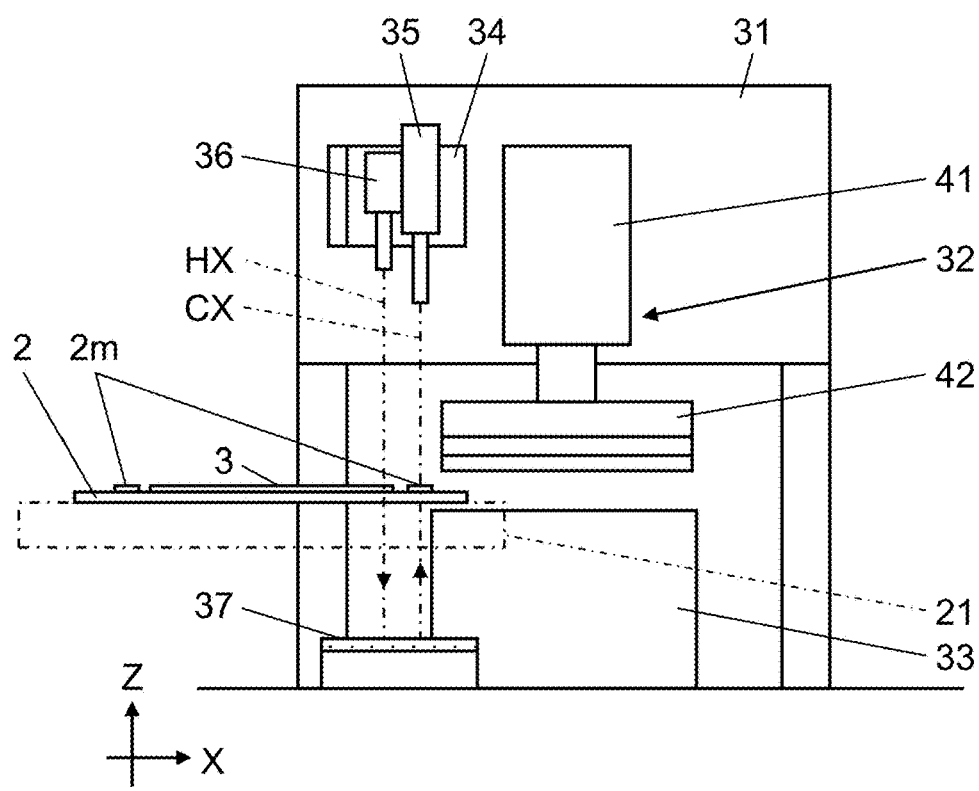
FIG. 8B is a front view illustrating the state where the component press-bonding device according to the exemplary embodiment of the disclosure images the marks of the board.

When one mark 2m, out of two marks 2m included in board 2, is imaged and recognized as described above, controller 60 causes table moving mechanism 22 to move board holding table 21 in the X-axis direction and to position the other mark 2m within the imaging visual field of imaging camera 35 (FIG. 8B). Then, in the same procedures, mark 2m is imaged and this mark 2m is recognized based on the obtained image.

Figure 10:
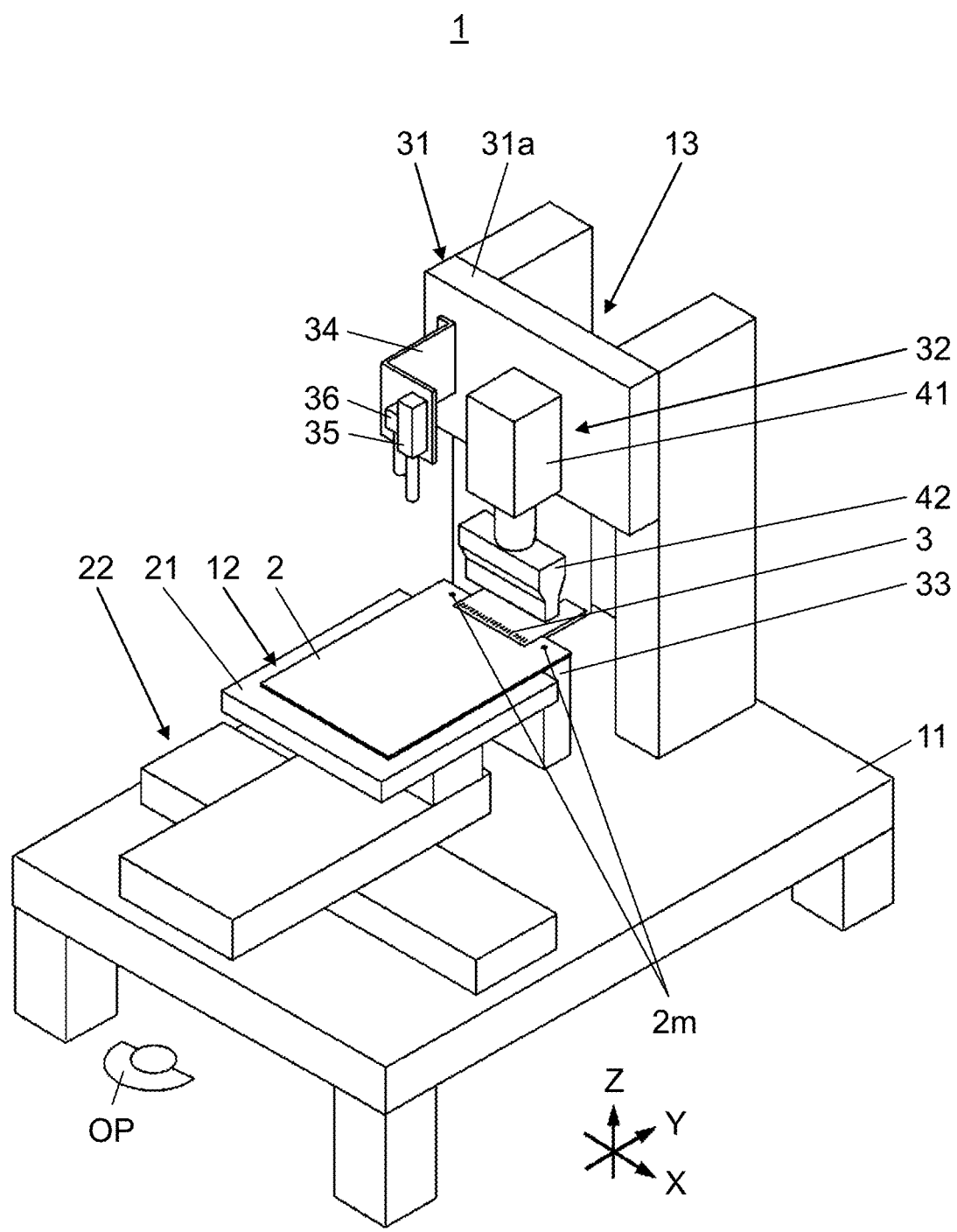
FIG. 10 is a perspective view illustrating a state where the component press-bonding device according to the exemplary embodiment of the disclosure causes the backup stage to support the board.
Figure 11:
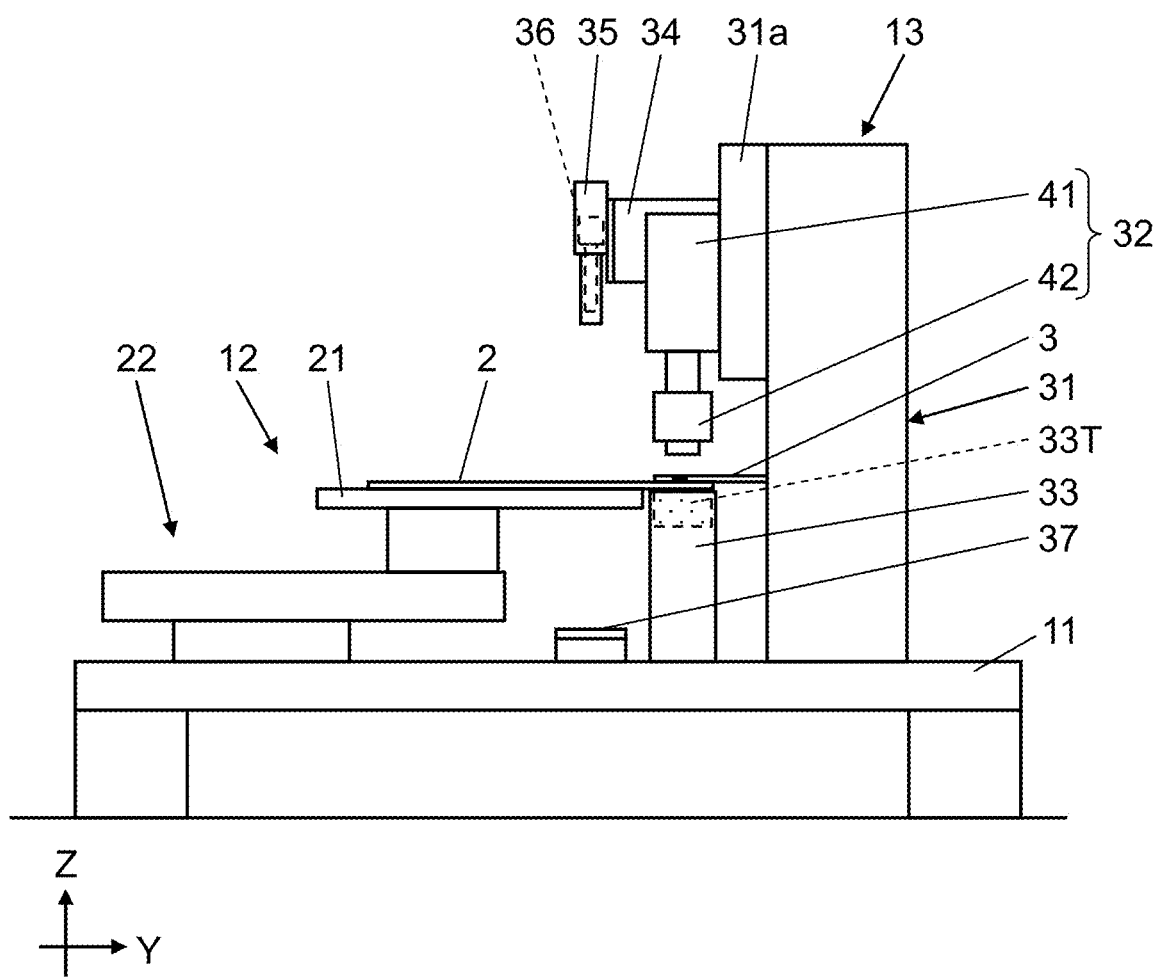
FIG. 11 is a side view illustrating the state where the component press-bonding device according to the exemplary embodiment of the disclosure causes the backup stage to support the board.

When two marks 2m are recognized by the imaging of imaging camera 35 as described above, controller 60 operates table moving mechanism 22 to move board holding table 21, and causes the lower surface of end region 2R of board 2 to be supported by an upper surface of backup stage 33 (upper surface 33S of porous material portion 33T) (FIG. 10 and FIG. 11). At this time, board 2 is positioned with respect to backup stage 33 based on recognition results of two marks 2m recognized through imaging by imaging camera 35.

When the lower surface of end region 2R of board 2 is supported by backup stage 33, controller 60 operates suction controlling valve 52 to generate suction force on upper surface 33S of porous material portion 33T. Consequently, end region 2R of board 2 is sucked to an upper surface side of porous material portion 33T and comes into close contact with upper surface 33S of porous material portion 33T. Thus, even in a case where deformation, such as a wrinkle and a warp, occurs in end region 2R of board 2, the deformation is corrected and end region 2R comes into a state of extending flat.

Although end region 2R of board 2 is sucked to the inside of the small holes of porous material portion 33T in a state of staying in contact with upper surface 33S of porous material portion 33T, the outer surface of board 2 is not pulled into the inside of the small holes since the diameters of the small holes of porous material portion 33T are approximately 60μ and are sufficiently smaller than the thickness of board 2. In addition, no void is generated in board 2.

Figure 12:
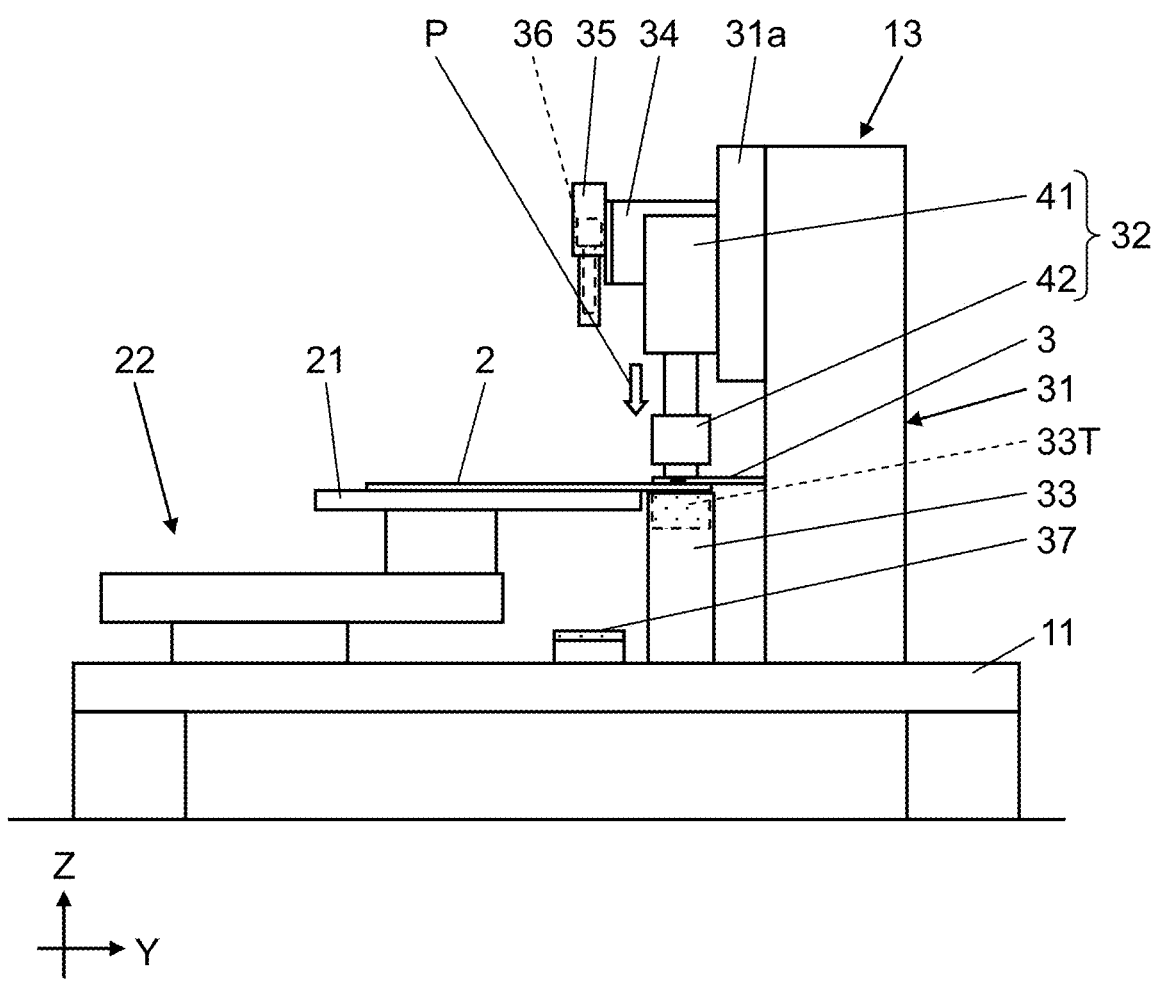
FIG. 12 is a side view illustrating a state where the component press-bonding device according to an exemplary embodiment of the disclosure presses a component to the board.

When end region 2R of board 2 is sucked through porous material portion 33T and extends flat, controller 60 operates pressing cylinder 41 to lower press tool 42 (arrow P illustrated in FIG. 12), and press tool 42 pushes component 3 to backup stage 33, along with board 2. Consequently, component 3 is pressed and press-bonded to end region 2R of board 2 (FIG. 12).

When component 3 is press-bonded to end region 2R of board 2, controller 60 operates pressing cylinder 41 to raise press tool 42. When press tool 42 is raised, controller 60 operates suction controlling valve 52 to release the suction of board 2. Then, controller 60 operates table moving mechanism 22 to move board holding table 21 to the immediate front, and board 2 is positioned at a predetermined handover position where the board is handed over to a downstream side step. With this, component press-bonding work is terminated.

As described above, component press-bonding device 1 in the exemplary embodiment is component press-bonding device 1 that performs work related to component mounting on board 2 after marks 2m provided in transparent end region 2R of board 2 are recognized. Component press-bonding device 1 includes imaging camera 35 provided with the imaging optical axis thereof extending downwards, light emitter 36 irradiating end region 2R with illumination light from above board 2 in a state where marks 2m are positioned within the imaging visual field of imaging camera 35, and light reflecting member 37 that is provided below imaging camera 35 and reflects the illumination light, which is emitted by light emitter 36 and is transmitted downwards through end region 2R, back to end region 2R. Imaging camera 35 images marks 2m under the illumination light, which is reflected by light reflecting member 37 and is transmitted upwards through end region 2R.

In component press-bonding device 1 of the exemplary embodiment, imaging camera 35 images marks 2m under illumination light, which is emitted by light emitter 36 from above board 2, is transmitted downwards through end region 2R of board 2, is reflected by light reflecting member 37, and is transmitted upwards through end region 2R (that is, under the same circumstances where marks 2m are illuminated by transmitted illumination light), in a case where imaging camera 35 images marks 2m provided in end region 2R of board 2. For this reason, in component press-bonding device 1 of the exemplary embodiment, marks 2m provided on board 2 are clearly recognized and work with respect to board 2 (work of positioning board 2 with respect to backup stage 33 and component press-bonding work of press-bonding component 3 to board 2) can be performed even in a case where board 2 is formed of a film member.

Although the imaging of marks 2m can be realized under transmitted illumination light by providing a light emitter, which emits illumination light upwards from below board 2, below imaging camera 35, there is a case where such a light emitter cannot be provided below imaging camera 35 as in component press-bonding device 1 of the exemplary embodiment having a configuration where marks are positioned within the imaging visual field of imaging camera 35 by moving board holding table 21, which holds board 2. With such a configuration as in the exemplary embodiment, marks 2m can be clearly imaged under such circumstances and an effect thereof is large.

Although the exemplary embodiment of the disclosure has been described until now, the disclosure is not limited to the exemplary embodiment described above. For example, although irradiation optical axis HX of illumination light of light emitter 36 and imaging optical axis CX of imaging camera 35 are non-coaxial in the exemplary embodiment described above, a configuration where irradiation optical axis HX of illumination light of light emitter 36 and the imaging optical axis CX of imaging camera 35 are coaxial can also be adopted. However, the image of marks 2m obtained by imaging tends to be clearer in a case where irradiation optical axis HX and imaging optical axis CX are non-coaxial than in a case where the irradiation optical axis and the imaging optical axis are coaxial. In view of this, it is preferable that irradiation optical axis HX and imaging optical axis CX be in parallel with each other but be not coaxial. That is, it is preferable that irradiation optical axis and imaging optical axis be in parallel with each other and non-coaxial. Although board 2 is described as being transparent in the exemplary embodiment described above, "transparent" means "having optical transparency", and board 2 transmits both of illumination light emitted by light emitter 36 and reflected illumination light (illumination light reflected by light reflecting member 37). Therefore, even if board 2 is a seemingly so-called "semitransparent" board, this board 2 is "transparent" in the disclosure insofar as board 2 satisfies the function.

Although a component mounter is component press-bonding device 1 that performs work of press-bonding component 3 to board 2 in the exemplary embodiment described above, the component mounter may be a device that performs work related to component mounting on board 2. Accordingly, the component mounter may be, for example, a tape sticking device used in a tape sticking step of sticking bonding tape for bonding components to end region 2R of board 2 in a liquid crystal display manufacturing line.

A component mounter that can perform work of clearly recognizing a mark provided on a board even in a case where the board is formed of a film member and a mounting board manufacturing method are provided.

What is claimed is:

1. A component mounter configured to perform work related to component mounting on a board after a mark provided on a transparent end region of the board is recognized, the component mounter comprising:
    an imaging camera provided with an imaging optical axis extending downwards;
    a light emitter configured to irradiate the end region with illumination light from above the board in a state where the mark is positioned within an imaging visual field of the imaging camera; and
    a light reflecting member that is provided below the imaging camera and configured to reflect the illumination light, which is emitted by the light emitter and is transmitted downwards through the end region, back to the end region,
    wherein the imaging camera is configured to image the mark under the illumination light, which is reflected by the light reflecting member and is transmitted upwards through the end region, and
    wherein the component mounter is configured to hold the board such that the board is held separately from the light reflecting member when the mark is positioned within the imaging visual field of the imaging camera.

2. The component mounter of claim 1,
    wherein the light reflecting member has a retro-reflective function.

3. The component mounter of claim 1,
    wherein the component mounter is configured to mount a component on the board, wherein the board is formed of a film member.

4. The component mounter of claim 1,
    wherein an irradiation optical axis of the illumination light of the light emitter and the imaging optical axis of the imaging camera are in parallel with each other and are non-coaxial.

5. The component mounter of claim 1,
    wherein the light reflecting member is disposed on a surface of the component mounter.

6. A mounting board manufacturing method for a component mounter that performs work related to component mounting on a board after a mark provided on a transparent end region of the board is recognized, the method comprising:
    a step of placing the board on the component mounter, the component mounter having an imaging camera and a light emitter and a light reflecting member,
    holding the board separately from the light reflecting member so that the mark is positioned within an imaging visual field of the imaging camera;
    a light emission step of emitting illumination light to the end region from above the board by the light emitter in a state where the mark is positioned within the imaging visual field of the imaging camera provided with an imaging optical axis extending downwards;
    a light reflection step of reflecting the illumination light, which is emitted by the light emitter and is transmitted downwards through the end region, back to the end region by the light reflecting member provided below the imaging camera; and
    an imaging step of imaging the mark under the illumination light, which is reflected in the light reflection step and is transmitted upwards through the end region, by the imaging camera.

7. A mounting board manufacturing method for a component mounter that performs work related to component mounting on a board after a mark provided on a transparent end region of the board is recognized, the method comprising:
    a step of placing the board on the component mounter, the component mounter having an imaging camera and a light emitter and a light reflecting member,
    a light emission step of emitting illumination light to the end region from above the board by the light emitter in a state where the mark is positioned within an imaging visual field of the imaging camera provided with an imaging optical axis extending downwards;

a light reflection step of reflecting the illumination light, which is emitted by the light emitter and is transmitted downwards through the end region, back to the end region by the light reflecting member provided below the imaging camera, wherein the light reflecting member has a retro-reflective function; and an imaging step of imaging the mark under the illumination light, which is reflected in the light reflection step and is transmitted upwards through the end region, by the imaging camera.

\* \* \* \* \*